(12) United States Patent
Fang et al.

(10) Patent No.: US 10,367,059 B2
(45) Date of Patent: Jul. 30, 2019

(54) METHOD OF MANUFACTURING A SEMICONDUCTOR STRUCTURE HAVING A BURIED RAISED PORTION

(71) Applicant: TAIWAN SEMICONDUCTOR MANUFACTURING CO., LTD., Hsinchu (TW)

(72) Inventors: Cong-Min Fang, Hsinchu (TW); Kang-Min Kuo, Hsinchu County (TW); Shi-Min Wu, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 13 days.

(21) Appl. No.: 15/700,115

(22) Filed: Sep. 9, 2017

(65) Prior Publication Data

US 2017/0373143 A1 Dec. 28, 2017

Related U.S. Application Data

(62) Division of application No. 14/718,841, filed on May 21, 2015, now Pat. No. 9,761,658.

(60) Provisional application No. 62/098,101, filed on Dec. 30, 2014.

(51) Int. Cl.
*H01L 29/06* (2006.01)
*H01L 21/762* (2006.01)

(52) U.S. Cl.
CPC .... *H01L 29/0649* (2013.01); *H01L 21/76229* (2013.01); *H01L 29/0657* (2013.01)

(58) Field of Classification Search
CPC ............. H01L 29/0649; H01L 29/0657; H01L 29/6681; H01L 21/76229
See application file for complete search history.

(56) References Cited

U.S. PATENT DOCUMENTS

| | | | |
|---|---|---|---|
| 2005/0139951 A1 | 6/2005 | Pyi | |
| 2010/0283108 A1 | 11/2010 | Sawada et al. | |
| 2013/0309838 A1 | 11/2013 | Wei et al. | |
| 2014/0035053 A1* | 2/2014 | Kawa | H01L 27/0207 257/368 |
| 2014/0061775 A1 | 3/2014 | Chuang et al. | |
| 2014/0131813 A1 | 5/2014 | Liaw | |
| 2015/0060959 A1* | 3/2015 | Lin | H01L 29/785 257/288 |
| 2015/0221556 A1* | 8/2015 | Zhang | H01L 21/82343 438/478 |
| 2015/0249127 A1 | 9/2015 | Xie et al. | |
| 2015/0279972 A1* | 10/2015 | Xie | H01L 29/66795 438/283 |

FOREIGN PATENT DOCUMENTS

| | | |
|---|---|---|
| CN | 1638087 A | 7/2005 |
| CN | 103107196 A | 5/2013 |
| CN | 103681849 A | 3/2014 |

(Continued)

*Primary Examiner* — Thanh Y. Tran
(74) *Attorney, Agent, or Firm* — Maschoff Brennan

(57) ABSTRACT

A method of manufacturing a semiconductor structure includes the following steps. A first raised portion is formed on a semiconductor substrate. The height of the first raised portion is reduced, and a dielectric material is formed over the first raised portion. The dielectric material is annealed such that the first raised portion is tilted.

20 Claims, 4 Drawing Sheets

(56) References Cited

FOREIGN PATENT DOCUMENTS

| KR | 10-2005-0067466 A | 7/2005 |
|---|---|---|
| KR | 2010-0121437 A | 11/2010 |
| KR | 2014-0030019 A | 3/2014 |
| TW | 388934 B | 5/2000 |
| TW | 200644154 A | 12/2006 |

* cited by examiner

METHOD OF MANUFACTURING A SEMICONDUCTOR STRUCTURE HAVING A BURIED RAISED PORTION

PRIORITY CLAIM AND CROSS-REFERENCE

The present application is a divisional of the application Ser. No. 14/718,841, filed May 21, 2015, which claims priority to U.S. Provisional Application Ser. No. 62/098,101, filed Dec. 30, 2014, now U.S. Pat. No. 9,761,658, issued on Sep. 12, 2017, all of which are herein incorporated by reference in their entirety.

BACKGROUND

Shallow trench isolation (STI) is an integrated circuit feature which prevents electrical current leakage between adjacent semiconductor devices. STI is generally used on complementary metal-oxide-semiconductor (CMOS) process technology nodes of 250 nanometers and smaller. Older CMOS technologies and non-metal-oxide-semiconductor (MOS) technologies commonly use isolation based on local oxidation of silicon (LOCOS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
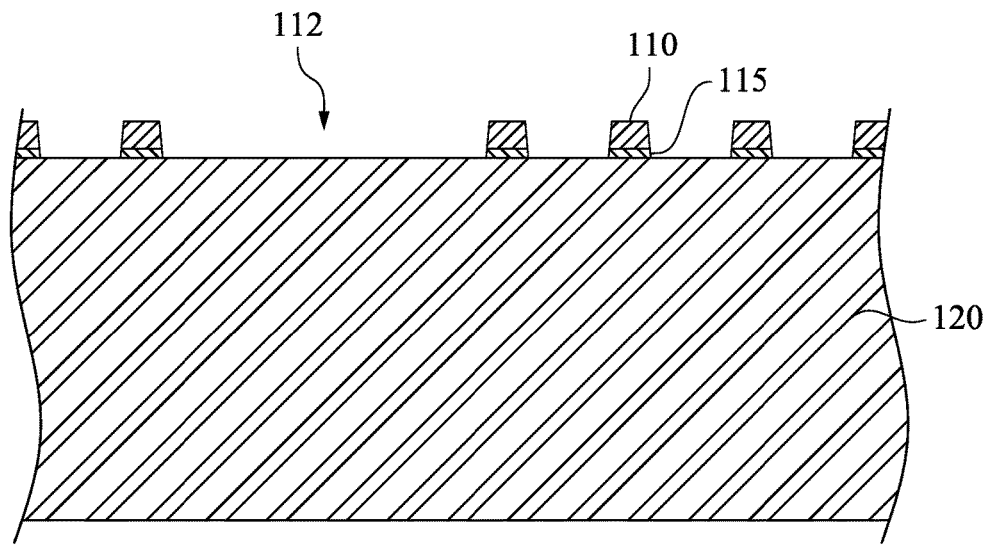
FIGS. 1-8 are cross-sectional views of shallow trench isolation (STI) structures at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-8 are cross-sectional views of shallow trench isolation (STI) structures at various stages in accordance with some embodiments.

Reference is made to FIG. 1. A hard mask layer 110 is formed on a substrate 120 and has openings 112 therein to define active areas and raised portions which will be formed in the followings steps. The substrate 120 is made of a semiconductor material, such as diamond, silicon, germanium, silicon carbide, silicon-germanium, or combinations thereof. The substrate 120 is, for example, doped or undoped bulk silicon or an active layer of a silicon on insulator (SOI) substrate. Other substrates that may be used include multi-layered substrates, gradient substrates, or hybrid orientation substrates.

The active areas will be used for components of active devices, such as n-channel metal-oxide-semiconductor field-effect transistors (n-channel MOSFETs), p-channel MOSFETs, planar MOSFETs, or fin field-effect transistors (finFETs), to be formed later. The active areas are formed by, for example, the implantation of dopants into the substrate 120. Depending upon the dopants chosen, the active areas may include n-wells or p-wells as determined by the design. If the substrate 120 is made of a Group IV semiconductor material, such as diamond, silicon, germanium, silicon carbide, silicon-germanium, or combinations thereof, the dopants can be acceptors from Group III or donors from Group V elements. For example, boron (B), aluminium (Al), indium (In), gallium (Ga), or combinations thereof, having three valence electrons, can be used as the dopants to form a p-well in the substrate 120 when the substrate 120 is made of a Group IV semiconductor material with four valence electrons. On the other hand, phosphorus (P), arsenic (As), antimony (Sb), bismuth (Bi), or combinations thereof, having five valence electrons, can be used as the dopants to form an n-well in the substrate 120 when the substrate 120 is made of a Group IV semiconductor material with four valence electrons.

The hard mask layer 110 is made of a material which can be a barrier against water molecules and oxygen. In some embodiments, the hard mask layer 110 is made of, for example, silicon nitride. The hard mask layer 110 has a thickness in a range from about 400 angstroms to about 2000 angstroms. The hard mask layer 110 is formed by, for example, chemical vapor deposition (CVD), low pressure chemical vapor deposition (LPCVD), plasma enhanced chemical vapor deposition (PECVD), or other deposition processes.

The terms "about" may be applied to modify any quantitative representation which could permissibly vary without resulting in a change in the basic function to which it is related. For example, the hard mask layer 110 as disclosed herein having a thickness in a range from about 400 angstroms to about 2000 angstroms may permissibly have a thickness somewhat less than 400 angstroms if its barrier capability is not materially altered.

A barrier layer 115 may be formed on the substrate 120 before the hard mask layer 110 is formed. The barrier layer 115 is made of a material which can enhance an adhesion between the hard mask layer 110 and the substrate 120. In some embodiments, the barrier layer 115 is made of, for example, silicon oxide. The barrier layer 115 has a thickness in a range from about 50 angstroms to about 200 angstroms. The barrier layer 115 is formed by a thermal process, such as thermal oxidation or other deposition processes.

Although FIG. 1 shows the barrier layer 115 is sandwiched between the hard mask layer 110 and the substrate 120, the barrier layer 115 could permissibly be omitted. In some embodiments, the hard mask layer 110 can be formed on the substrate 120 in absence of the barrier layer 115 if the adhesion between the hard mask layer 110 and the substrate 120 is at an acceptable level.

The hard mask layer 110 and the barrier layer 115 are patterned to form the openings 112 therein to expose portions of the substrate 120 where trenches will be formed in the followings steps. The hard mask layer 110 and the barrier layer 115 are patterned by a photolithography and etching process. The photolithography and etching process includes photoresist application, exposure, developing, etching, and photoresist removal. The photoresist is applied onto the substrate 120 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. Portions of the hard mask layer 110 and the barrier layer 115 which are not protected by the remaining photoresist are etched to form the openings 112. The etching of the hard mask layer 110 and the barrier layer 115 may be, for example, reactive-ion etching (RIE). After etching the hard mask layer 110 and the barrier layer 115, the photoresist is removed from the substrate 120 by, for example, ashing or stripping.

The Reactive-ion etching (RIE) is a type of dry etching which has different characteristics than wet etching. RIE uses chemically reactive plasma to form the openings 112. The plasma is generated under low pressure (vacuum) by an electromagnetic field. High-energy ions from the chemically reactive plasma attack the hard mask layer 110 and the barrier layer 115 and react with them. In some embodiments, fluorocarbon or hydrofluorocarbon based RIE can be used to form the openings 112.

A cleaning process may be performed to remove a native oxide of the substrate 120 after the hard mask layer 110 and the barrier layer 115 are patterned. In some embodiments, the native oxide of the substrate 120 can be removed by hydrofluoric acid. The cleaning process is optional. In some embodiments, the cleaning process can be omitted if the native oxide of the substrate 120 is at an acceptable level.

Figure 2:
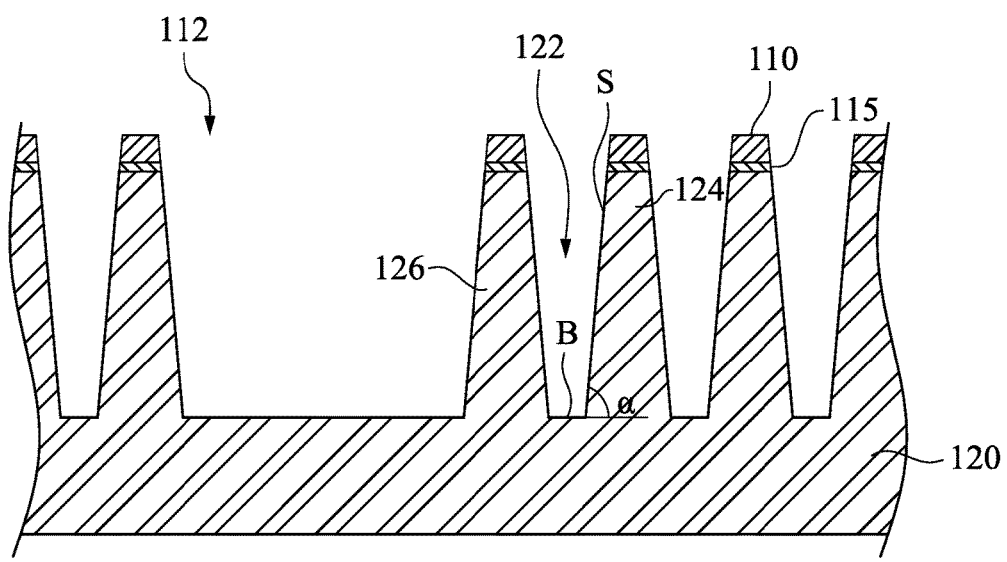

Reference is made to FIG. 2. Trenches 122 are formed in the substrate 120. The trenches 122 define the active areas 124 and the raised portions 126. That is, the trenches 122 separate the active areas 124 and the raised portions 126 from one another. The exposed portions of the substrate 120 through the openings 112 are removed by an etching process, such as reactive-ion etching (RIE), in order to form the trenches 122 in the substrate 120.

In some embodiments, chlorine (Cl) or bromine (Br) based reactive-ion etching (RIE) can be used to form the trenches 122. At least one of the trenches 122 has a depth in a range from about 0.3 μm to about 0.5 μm. At least one of the trenches 122 has at least one sidewall S, a bottom surface B, and a taper angle α between the sidewall S and a plane extending from the bottom surface B. The taper angle α of the trench 122 is in a range from about 78° to about 88°.

Figure 3:
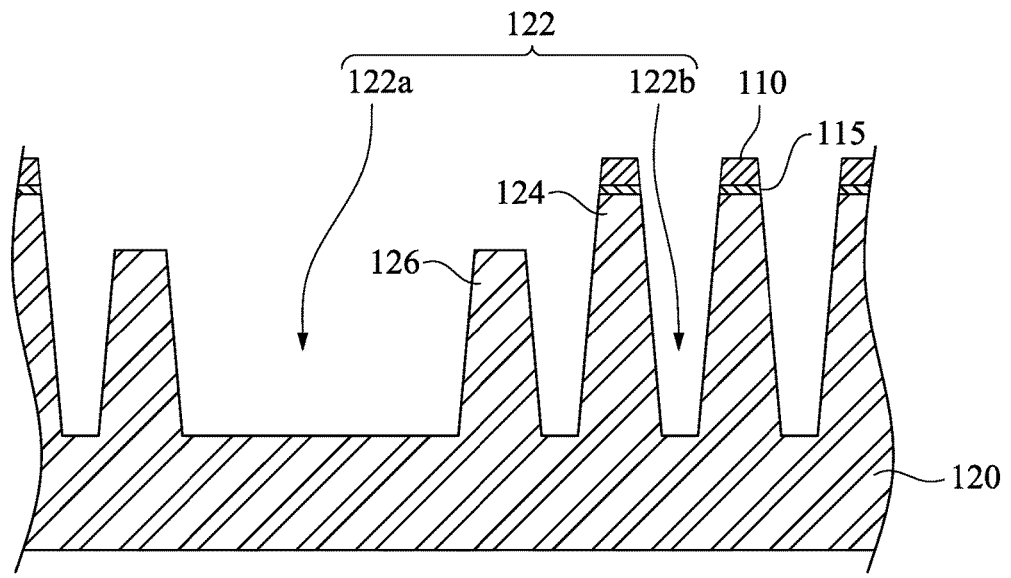

Reference is made to FIG. 3. The heights of the raised portions 126 are reduced by, for example, a photolithography and etching process. After reducing the heights of the raised portions 126, the trenches 122 defining the raised portions 126 are combined into a first trench 122a, and the raised portions 126 are disposed in the first trench 122a. The photolithography and etching process includes photoresist application, exposure, developing, etching, and photoresist removal. The photoresist is applied onto the substrate 120 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. After developing, the raised portions 126 are not protected by the remaining photoresist while the active areas 124 are protected by the remaining photoresist. The raised portions 126, which are not protected by the remaining photoresist, are etched to reduced the heights of the raised portions 126. After etching the raised portions 126, the photoresist is removed from the substrate 120 by, for example, ashing or stripping.

Figure 4:
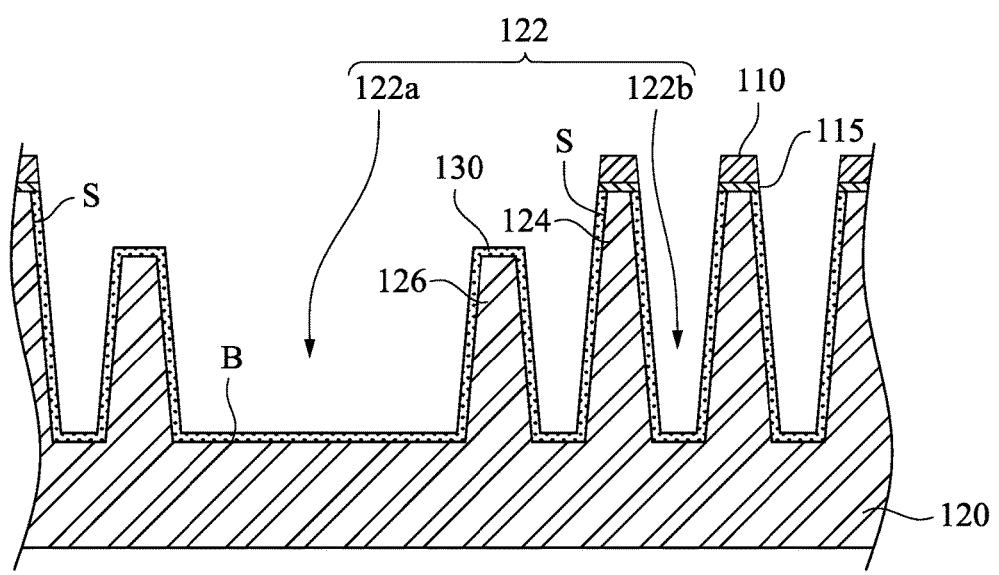

Reference is made to FIG. 4. A liner layer 130 is formed on the sidewalls S and the bottom surfaces B of the trenches 122. In some embodiments, the liner layer 130 is made of, for example, silicon oxide. The liner layer 130 has a thickness in a range from about 100 angstroms to about 400 angstroms. The liner layer 130 may be formed by, for example, thermal oxidation. In some embodiments, a temperature for the formation of the liner layer 130 is in a rage from about 800° C. to about 1200° C.

The liner layer 130 can repair structural damages incurred in the substrate 120 by the etching process for forming the trenches 122. Furthermore, corner rounding may be achieved during the formation of the liner layer 130. During the thermal oxidation, the corners of the substrate 120 at perimeters of the trenches 122 may be rounded automatically as the liner layer 130 is formed because the oxidation speed at the corners of the substrate 120 is higher than the oxidation speed at other surfaces. With the rounded corner, the divot which may be formed in the following steps and may result in a parasitic transistor with a low threshold voltage can be eliminated or reduced to an acceptable level. In some embodiments, the rounded corner has a radius of curvature in a range from about 300 angstroms to about 600 angstroms.

Figure 5:
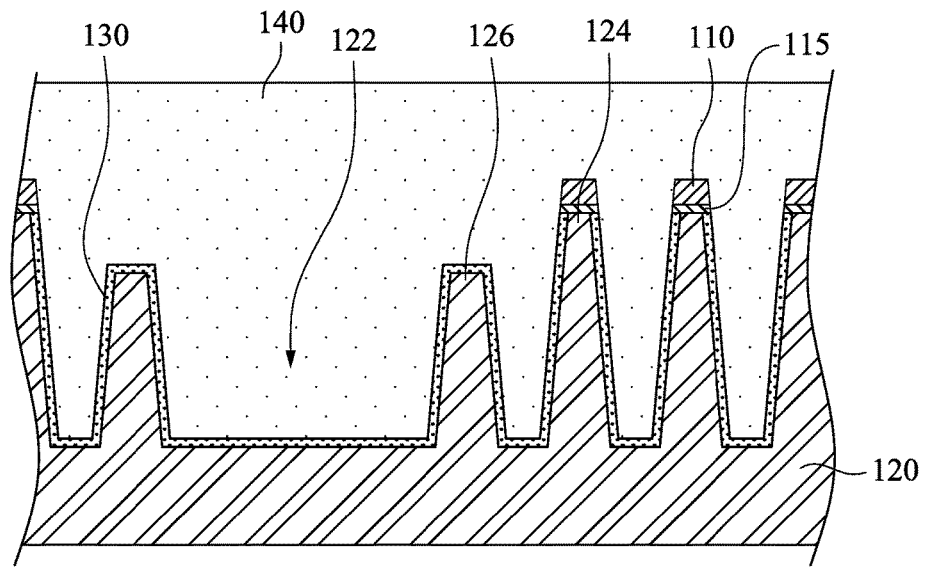

Reference is made to FIG. 5. A flowable dielectric 140 overfills the trenches 122 to form the shallow trench isolation (STI) structures. The flowable dielectric 140 may include a flowable silicon oxide or silicon nitride dielectric material. The flowable dielectric 140 is formed by using a spin on dielectric (SOD), such as a silicate, a siloxane, a methyl SilsesQuioxane (MSQ), a hydrogen SisesQuioxane (HSQ), an MSQ/HSQ, a perhydrosilazane (TCPS), or a perhydro-polysilazane (PSZ). Alternatively, the flowable dielectric 140 may be formed by using a deposition technique, such as plasma enhanced chemical vapor deposition (PECVD). A temperature for the formation of the flowable dielectric 140 in the PECVD is less than about 100° C. A pressure for the formation of the flowable dielectric 140 in the PECVD is in a range from about 100 mTorr to about 10 Torr. A reaction source uses a gaseous environment containing $Si_3H_9N$ and $NH_3$. In some embodiments, a flow rate of $Si_3H_9N$ is in a range from about 100 standard cubic centimeters per minute (sccm) to about 1000 sccm, and a flow rate of $NH_3$ is in a range from about 100 sccm to about 2000 sccm.

Figure 6:
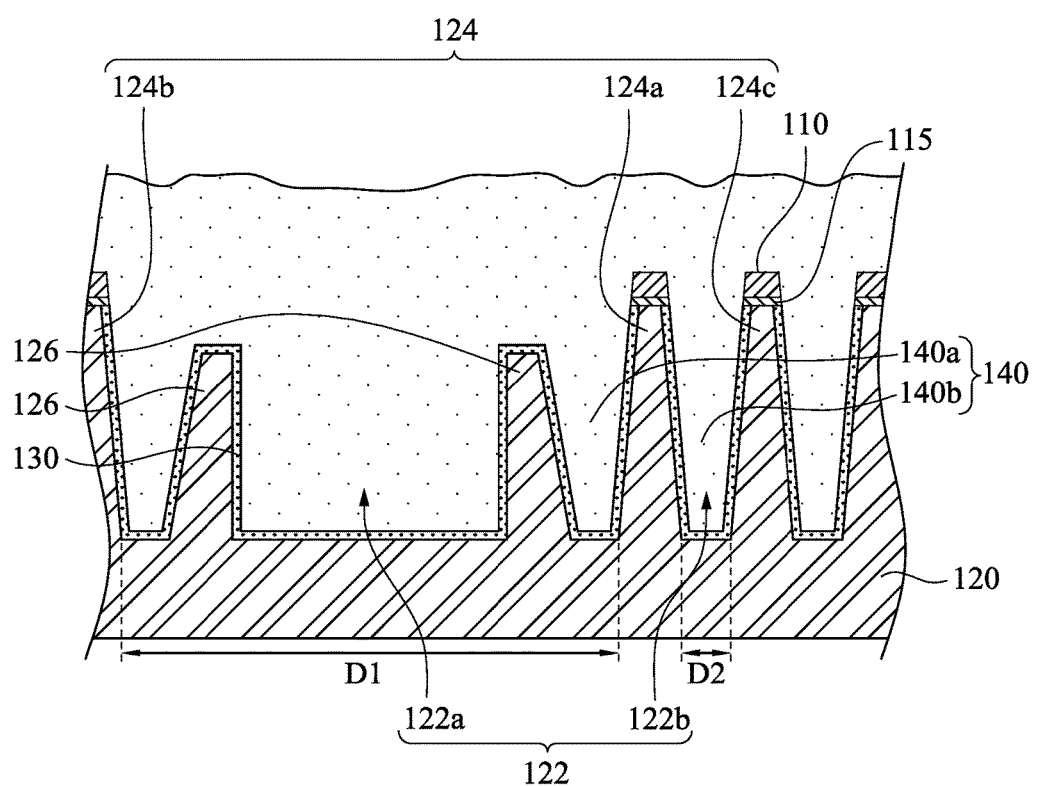

Reference is made to FIG. 6. A curing process is performed on the flowable dielectric 140. In some embodiments, the curing process is operated in a flow rate of $O_3$ in a range from about 100 standard cubic centimeters per minute (sccm) to about 5000 sccm. A temperature for the curing process is in a range from about 10° C. to about 500° C. A pressure for the curing process is in a range from about 1 Torr to about 760 Torr. It is believed that the curing of the flowable dielectric 140 enables the transformation of Si—O bond network to densify the flowable dielectric 140.

An anneal process is then performed. The anneal process could further densify and improve the quality of the flowable dielectric 140. In some embodiments, the anneal process is performed in an environment containing steam. A flow rate of the steam is in a range from about 5 standard cubic centimeters per minute (sccm) to about 20 sccm. A temperature for the anneal process is in a range from about 1000° C. to about 1200° C. The anneal process may start at about 200° C. and ramp up the temperature gradually to a predetermined temperature of about 1000° C. to about 1200° C.

During the curing and/or the annealing of the flowable dielectric 140, the flowable dielectric 140 shrinks as it densifies. The shrinkage of the flowable dielectric 140 applies tensile force on the active areas 124 and the raised portions 126. The tensile force applied on the active areas 124 and the raised portions 126 depends on the amount that the flowable dielectric 140 shrinks. That is, the tensile force applied on the active areas 124 and the raised portions 126 increases as the amount that the flowable dielectric 140 shrinks increases. Therefore, the flowable dielectric 140 in the larger trench 122 may apply greater tensile force on the active areas 124 or the raised portions 126.

For example, the active areas 124 of FIG. 6 include a first active area 124a, a second active area 124b, and a third active area 124c. The trenches 122 include the first trench 122a and a second trench 122b. The flowable dielectric 140 includes a first dielectric 140a and a second dielectric 140b. The first trench 122a separates the first active area 124a and the second active area 124b from each other. The second trench 122b separates the first active area 124a and the third active area 124c from each other. The first dielectric 140a is in the first trench 122a. The second dielectric 140b is in the second trench 122b. The first trench 122a is wider than the second trench 122b. That is, a first distance D1 between the first active area 124a and the second active area 124b is greater than a second distance D2 between the first active area 124a and the third active area 124c. Since the first dielectric 140a and the second dielectric 140b are made of substantially the same flowable dielectric material, the tensile force due to the shrinkages of the first dielectric 140a and the second dielectric 140b mainly depends on the sizes of the first trench 122a and the second trench 122b. Therefore, if the raised portions 126 were absent from the first trench 122a, the first dielectric 140a would apply greater tensile force on the first active area 124a than the tensile force applied by the second dielectric 140b on the first active area 124a. The unbalance tensile force applied on the first active area 124a may bend the first active area 124a and thus damage the first active area 124a or introduce crystal defects in the first active area 124a.

As shown in FIG. 6, the raised portions 126 are formed in the first trench 122a to reduce the shrinkage of the first dielectric 140a. With the raised portions 126, the tensile force applied on the first active area 124a by the first dielectric 140a and the second dielectric 140b is substantially balanced. Therefore, the damage to the first active area 124a or the crystal defects introduced in the first active area 124a by the unbalanced tensile force can be eliminated or reduced to an acceptable level.

In some embodiments, the tensile force due to the shrinkage of the first dielectric 140a may be applied on the raised portions 126 to bend the raised portions 126. In those embodiments, the raised portions 126 can be considered sacrificial structures which protect at least the first active area 124a from being bent by the shrinkage of the first dielectric 140a.

In some embodiments, the raised portion is formed in a trench which is disposed in an isolation area of the substrate. The trench in the isolation area of the substrate is wider than the trench in a dense area of the substrate. The raised portion is formed in the trench in the isolation area of the substrate to reduce the amount of dielectric shrinkage, thereby balancing the tensile force applied on the active area. For example, the first trench 122a of FIG. 6 is in the isolation area of the substrate 120, and the second trench 122b of FIG. 6 is in the dense area of substrate 120. The first trench 122a is wider than the second trench 122b. The raised portions 126 are formed in the first trench 122a to reduce the shrinkage of the first dielectric 140a, thereby balancing the tensile force applied on the first active area 124a.

The number of the raised portion(s) in one trench depends on the size of the trench. Specifically, the number of the raised portion(s) increases as the size of the trench increases when the size(s) of the raised portion(s) stays the same.

Although FIG. 6 shows the number of the raised portions 126 in the first trench 122a is two, the number of the raised portions 126 in the first trench 122a could permissibly vary without resulting in a material change in the force balance. For example, there may permissibly be other numbers of raised portion(s) in one trench, such as one, three, four, or more, within the claimed scope if the force balance is not materially altered.

The size(s) of the raised portion(s) depends on the size of the trench as well. Specifically, the size(s) of the raised portion(s) increases as the size of the trench increases when the number of the raised portion(s) stays the same.

In some embodiments, at least one of the raised portions 126 has a width in a range from about 50 nm to about 400 nm. At least one of the raised portions 126 has a length in a range from about 50 nm to about 400 nm. At least one of the raised portions 126 has a height in a range from about 50 nm to about 250 nm. The size of the raised portion 126 could permissibly vary without resulting in a material change in the force balance. For example, the height of the raised portion 126 may permissibly be less than 50 nm within the claimed scope if the force balance is not materially altered.

Figure 7:
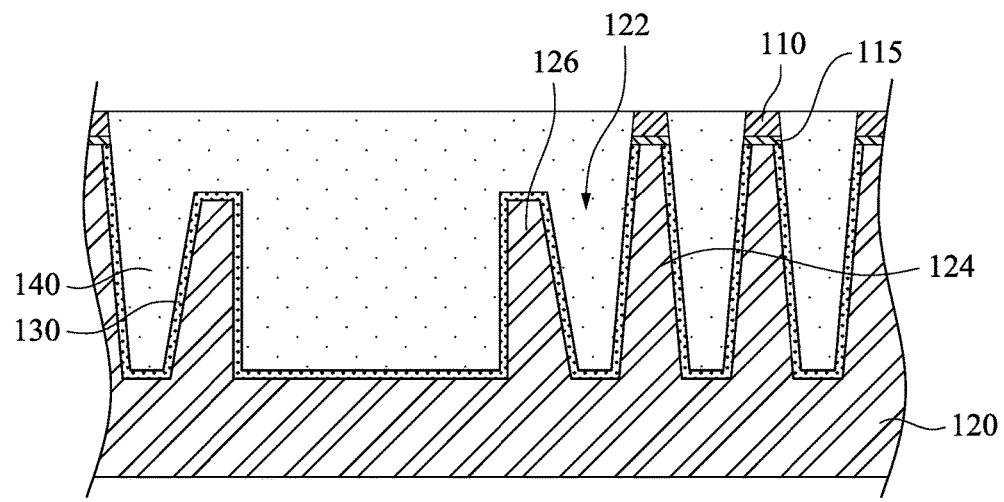

Reference is made to FIG. 7. The excess flowable dielectric 140 outside of the trenches 122 is removed through a removal process. In some embodiments, the flowable dielectric 140 over burden is removed by a chemical mechanical polishing (CMP) process. In some embodiments, a combination of a plasma etch-back followed by the CMP process is used. The hard mask layer 110 acts as a polish stop layer to protect the underlying active areas 124 from CMP damage.

Figure 8:
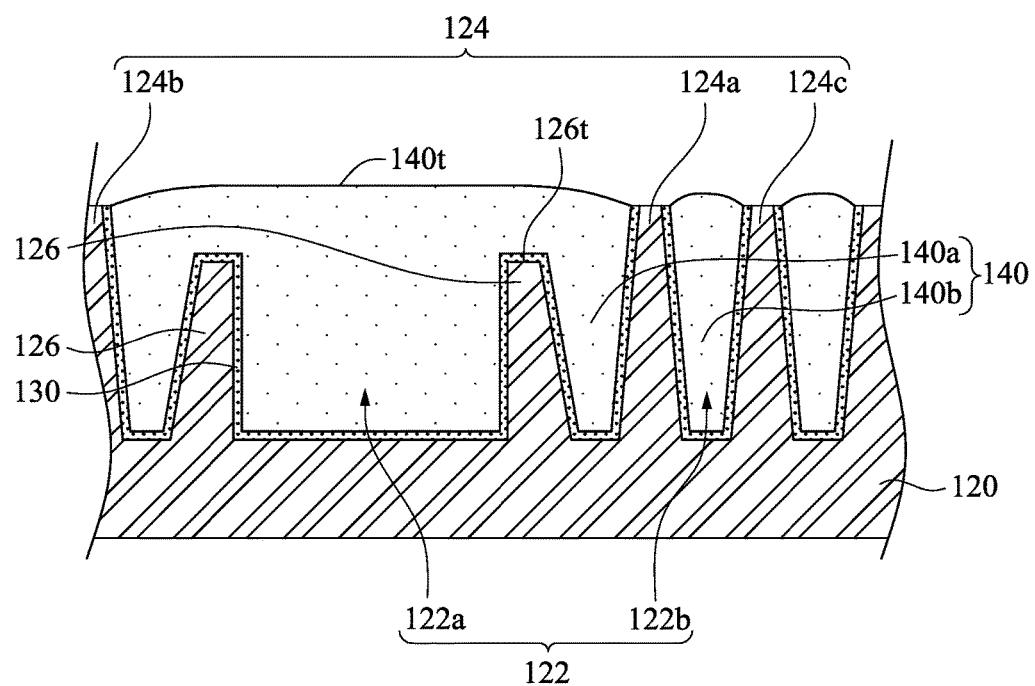

Reference is made to FIG. 8. The hard mask layer 110 and the barrier layer 115 are removed by an etching process, such as a wet etching process. In some embodiments, the hard mask layer 110 can be removed by hot phosphoric acid when the hard mask layer 110 is made of silicon nitride, and the barrier layer 115 can be removed by hydrofluoric acid when the barrier layer 115 is made of silicon oxide. The removals of the hard mask layer 110 and the barrier layer 115 expose the active areas 124 to further process steps.

Reference is made to FIG. 8. The raised portions 126 are buried under the first dielectric 140*a*. That is, the first dielectric 140*a* covers the raised portions 126. In some embodiments, the first active area 124*a* is higher than the raised portions 126, and the second active area 124*b* is higher than the raised portions 126 as well. At least one of the raised portions 126 has a top surface 126*t*. The first dielectric 140*a* has a top surface 140*t*. The top surface 126*t* of the raised portion 126 is lower than the top surface 140*t* of the first dielectric 140*a*. Since the raised portions 126 are buried under the first dielectric 140*a*, the first dielectric 140*a* can still electrically isolate the first active area 124*a* and the second active area 124*b* from each other even if the raised portions 126 are made of a semiconductor material. In some embodiments, the raised portions 126 and the substrate 120 are made of substantially the same semiconductor material since the raised portions 126 are formed by etching the substrate 120.

In order to prevent the active area from being damaged by the shrinkage of the flowable dielectric, at least one raised portion is formed to balance the tensile force applied on the active area. When a shallow trench isolation (STI) trench adjacent to the active area is too large such that the shrinkage of the flowable dielectric in the STI trench applies unbalance tensile force on the active area, at least one raised portion can be formed in the STI trench to balance the tensile force applied on the active area. The raised portion can be a sacrificial structure which absorbs the tensile force created by the shrinkage of the flowable dielectric and thus protects the active area from being damaged by the shrinkage of the flowable dielectric. Furthermore, the raised portion is buried under the flowable dielectric, and therefore the flowable dielectric can still electrically isolate the active area from other areas even if the raised portion is made of a semiconductor material.

According to some embodiments, a method of manufacturing a semiconductor device includes forming a first trench and a second trench in a semiconductor substrate to define a raised portion between the first trench and the second trench; reducing a height of the raised portion; filling the first trench and the second trench with a flowable dielectric; and curing the flowable dielectric and tilting the raised portion.

According to some embodiments, a method of manufacturing a semiconductor device includes forming trenches in a semiconductor substrate to define first and second active regions and a raised portion in between the first and second active regions; reducing a height of the raised portion, such that the raised portion is lower than the first and second active regions; forming a dielectric material in the trenches; and densifying the dielectric material, such that the raised portion is tilted by the densifying the dielectric material.

According to some embodiments, a method of manufacturing a semiconductor structure includes forming a first raised portion on a semiconductor substrate; reducing a height of the first raised portion; forming a dielectric material over the first raised portion; and annealing the dielectric material and tilting the first raised portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first trench and a second trench in a semiconductor substrate to define a raised portion between the first trench and the second trench;
   reducing a height of the raised portion;
   filling the first trench and the second trench with a flowable dielectric;
   curing the flowable dielectric; and
   removing the flowable dielectric after the curing such that the raised portion is buried under the flowable dielectric after the removing.

2. The method of claim 1, wherein the raised portion is tilted during the curing.

3. The method of claim 1, wherein the first trench is wider than the second trench.

4. The method of claim 3, wherein the raised portion is tilted toward the first trench.

5. The method of claim 1, further comprising:
   forming a liner layer over the raised portion after the reducing.

6. The method of claim 5, wherein the liner layer is formed by thermal oxidation.

7. The method of claim 1, further comprising:
   providing the semiconductor substrate that has dense and isolation areas; and
   forming the raised portion in the isolation areas of the semiconductor substrate.

8. A method comprising:
forming trenches in a semiconductor substrate to define first and second active regions and a raised portion in between the first and second active regions;
reducing a height of the raised portion, such that the raised portion is lower than the first and second active regions;
forming a dielectric material in the trenches such that the dielectric material is over top surfaces of the first and second active regions;
densifying the dielectric material, such that the raised portion is tilted by the densifying the dielectric material; and
removing the dielectric material over the top surfaces of the first and second active regions after the densifying, wherein the raised portion is buried under the dielectric material after the removing.

9. The method of claim 8, wherein a first distance between the raised portion and the first active region is less than a second distance between the raised portion and the second active region.

10. The method of claim 9, wherein the raised portion is tilted toward the second active region.

11. The method of claim 8, wherein the densifying the dielectric material comprises:
annealing the dielectric material.

12. The method of claim 8, wherein the first active region is less tilted than the raised portion during the densifying.

13. The method of claim 12, wherein the second active region is less tilted than the raised portion during the densifying.

14. The method of claim 8, further comprising:
forming a liner layer over the raised portion after the reducing.

15. The method of claim 14, wherein the liner layer is formed by thermal oxidation.

16. A method comprising:
forming a first raised portion on a semiconductor substrate;
reducing a height of the first raised portion;
forming a dielectric material over the first raised portion;
annealing the dielectric material; and
removing the dielectric material after the annealing such that the first raised portion is buried under the dielectric material after the removing.

17. The method of claim 16, wherein the first raised portion is tilted during the annealing.

18. The method of claim 16, wherein the forming the first raised portion further forms a second raised portion on the semiconductor substrate; and further comprising:
tilting the second raised portion.

19. The method of claim 18, wherein the first and second raised portions are tilted toward each other.

20. The method of claim 18, wherein the second raised portion is tilted during the annealing.

* * * * *